United States Patent
Jungmann et al.

(10) Patent No.: US 9,343,182 B2
(45) Date of Patent: May 17, 2016

(54) DIRECT MEMORY BASED RING OSCILLATOR (DMRO) FOR ON-CHIP EVALUATION OF SRAM CELL DELAY AND STABILITY

(71) Applicant: International Business Machines Corporation, Armonk, NY (US)

(72) Inventors: Noam Jungmann, Tel Aviv (IL); Israel A. Wagner, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 13/939,008

(22) Filed: Jul. 10, 2013

(65) Prior Publication Data
US 2015/0015274 A1    Jan. 15, 2015

(51) Int. Cl.
G11C 29/50    (2006.01)
G11C 29/12    (2006.01)
G11C 11/41    (2006.01)

(52) U.S. Cl.
CPC .......... *G11C 29/50012* (2013.01); *G11C 29/50* (2013.01); *G11C 11/41* (2013.01); *G11C 2029/1202* (2013.01); *G11C 2029/1204* (2013.01)

(58) Field of Classification Search
CPC .............. G01R 31/31927; G11C 29/50; G11C 29/50012; G11C 2029/1202; G11C 2029/1204
See application file for complete search history.

(56) References Cited

U.S. PATENT DOCUMENTS

| | | | |
|---|---|---|---|
| 6,538,522 B1 | 3/2003 | Aipperspach et al. | |
| 6,734,744 B2* | 5/2004 | Monzel et al. | 331/57 |
| 7,082,067 B2* | 7/2006 | Venkatraman et al. | 365/201 |
| 7,142,064 B2* | 11/2006 | Chan et al. | 331/57 |
| 7,355,902 B2 | 4/2008 | Bhushan et al. | |
| 7,376,001 B2* | 5/2008 | Joshi et al. | 365/154 |
| 7,409,305 B1 | 8/2008 | Carpenter et al. | |
| 7,480,170 B1 | 1/2009 | Adams et al. | |
| 7,508,697 B1 | 3/2009 | Mukhopadhyay et al. | |
| 7,760,565 B2* | 7/2010 | Kuang et al. | 365/201 |
| 7,768,851 B2 | 8/2010 | Adams et al. | |
| 2008/0155362 A1* | 6/2008 | Chang et al. | 714/718 |
| 2012/0212997 A1 | 8/2012 | Chang et al. | |
| 2014/0002199 A1* | 1/2014 | Tsuruta | 331/57 |
| 2014/0210561 A1* | 7/2014 | Moriwaki | 331/57 |

OTHER PUBLICATIONS

Yang et al., "A Novel Test Method for Delay in SRAM FPGA Based on Ring Oscillator," Northwestern Polytechnical University, Xi'an, China, Mar. 2011.

Tsai et al., "SRAM Stability Characterization Using Tunable Ring Oscillators in 45nm CMOS," 2010 IEEE International Solid-State Circuits Conference Digest of Technical Papers ISSCC, pp. 354-355, 2010.

* cited by examiner

*Primary Examiner* — Vanthu Nguyen
(74) *Attorney, Agent, or Firm* — James R. Nock

(57) ABSTRACT

A novel and useful direct memory based ring oscillator (DMRO) circuit and related method for on-chip evaluation of SRAM delay and stability. The DMRO circuit uses an unmodified SRAM cell in each delay stage of the oscillator. A small amount of external circuitry is added to allow the ring to oscillate and detect read instability errors. An external frequency counter is the only equipment that is required, as there is no need to obtain an exact delay measurement and use a precise waveform generator. The DMRO circuit monitors the delay and stability of an SRAM cell within its real on-chip operating neighborhood. The advantage provided by the circuit is derived from the fact that measuring the frequency of a ring oscillator is easier than measuring the phase difference of signals or generating signals with precise phase, and delivering such signals to/from the chip. In addition, the DMRO enables monitoring of read stability failures.

17 Claims, 4 Drawing Sheets

DIRECT MEMORY BASED RING OSCILLATOR (DMRO) FOR ON-CHIP EVALUATION OF SRAM CELL DELAY AND STABILITY

FIELD OF THE INVENTION

The present invention relates to the field of semiconductor memory, and more particularly relates to a direct memory based ring oscillator (DMRO) circuit and related method for on-chip evaluation of SRAM delay and stability.

BACKGROUND OF THE INVENTION

Evaluation and measurement of the wordline to bitline delay is important in the design and manufacture of semiconductor static random access memory (SRAM) cells. The wordline to bitline delay is a part of the read access path delay in any array memory unit. It is important to properly evaluate the delay in order to determine the length of the critical path. Over estimation of the delay implies a too slow clock frequency, while under estimation may cause logical failures.

Existing methods for measuring this delay are complex, and hence the design of latch-based circuits is typically based on simulations. Testing the stability of cells is typically performed using customized test patterns, but it is difficult to interpret failures, as numerous other factors are at play. Thus, it has been difficult to measure on-chip wordline to bitline delay due to: (1) the difficulty in producing a precise delay at high frequencies; and (2) the difficulty in delivering the phases of clock and data to the SRAM cell within a chip because the probe/pad/line/connector delay is very complex to control and predict.

One common prior art technique for measuring this delay includes measuring the delay off-chip using precise waveform generators and oscilloscopes which relies on use of precision probes, cables and connectors. This technique requires costly equipment and is difficult to do in practice.

Another technique measures the delay using on-chip counters and delay lines. This requires the significant addition of circuitry to the layout, thus costing precious chip real estate. Yet another technique utilizes a ring oscillator, but with a modified version of the actual SRAM cell. This technique requires modification of the SRAM cell to include one or more logic gates within the cell itself which are required for the ring oscillator to oscillate. Thus, the SRAM cell under test is not the real world cell, but a modified one.

Other techniques use a ring oscillator, but with a special organization of the array that affects the behavior of the cell with respect to the real array organization.

There is thus a need for a circuit and related technique for measuring the wordline to bitline delay (i.e. the read access time) of an SRAM cell and to evaluate its stability in situ (i.e. while operating in a realistic environment) and without requiring the probing of any cells, or estimating the delay in a static manner, or where the cell is required to be modified from its real world operating configuration.

SUMMARY OF THE INVENTION

A novel and useful direct memory based ring oscillator (DMRO) circuit and related method for on-chip evaluation of SRAM delay and stability. The DMRO circuit uses an un-modified SRAM cell in each delay stage of the oscillator. A small amount of external circuitry is added to allow the ring to oscillate and detect read instability errors. An external frequency counter is the only equipment that is required, as there is no need to obtain an exact delay measurement and use of a precise waveform generator.

Further, the precision of the delay evaluation does not depend on on-chip delay lines or counters. Use of the DMRO circuit enables easy comparison of multiple versions of the SRAM cell circuit and gives a more realistic estimation of the real cell delay, as well as providing a monitor of cell instability. Note that the DMRO circuitry can be integrated as part of a built-in self-test (BIST) circuit for on-chip testing of SRAM cell behavior.

The invention comprises a DMRO circuit for monitoring the delay and stability of an SRAM cell within its real operating neighborhood, and a method for using it within an integrated circuit. The advantage provided by the circuit is derived from the fact that measuring the frequency of a ring oscillator is much easier than measuring the phase difference of signals or generating signals with precise phase, and delivering such signals to/from the chip.

The DMRO circuit of the present invention enables the measurement of the delay from wordline input to bitline output of a SRAM cell by incorporating this delay into a ring oscillator and measuring the frequency of the oscillator. In addition, the circuit provides an indication of non-stable data, where a READ operation changes the contents of an SRAM cell.

There is thus provided in accordance with the invention, a method of measuring the delay from wordline input to bitline output of a static random access memory (SRAM) cell, said method comprising providing a plurality of delay stage circuits configured to form a ring oscillator, each said delay stage comprising an SRAM cell, generating a falling edge in the output of each delay stage circuit in response to a rising edge of said wordline input, generating a rising edge in the output of each delay stage circuit in response to a falling edge of said wordline input, and measuring the frequency of said ring oscillator thereby evaluating the wordline to bitline delay of said SRAM cell.

There is also provided in accordance with the invention, a direct memory ring oscillator (DMRO) circuit for measuring the wordline to bitline delay of a static random access memory (SRAM) cell, comprising a plurality of delay stage circuits, each delay stage circuit comprising an SRAM cell, circuitry operative to generate a falling edge of the output of a delay stage circuit in response to the rising edge of the wordline, and to generate a rising edge of the output of said delay stage circuit in response to the falling edge of the wordline, wherein the frequency of the input to a delay stage circuit matches that its input, and wherein measuring the frequency of said DMRO corresponds to the wordline to bitline delay of said SRAM cell.

There is further provided in accordance with the invention, a method of measuring the delay and stability of a static random access memory (SRAM) cell, said method comprising incorporating the delay from a wordline input to a bitline output of said SRAM into delay stages of a ring oscillator, measuring the frequency of oscillation of said ring oscillator, wherein said frequency corresponds to said wordline to bitline delay.

BRIEF DESCRIPTION OF THE DRAWINGS

The invention is herein described, by way of example only, with reference to the accompanying drawings, wherein.

DETAILED DESCRIPTION OF THE INVENTION

Figure 1:
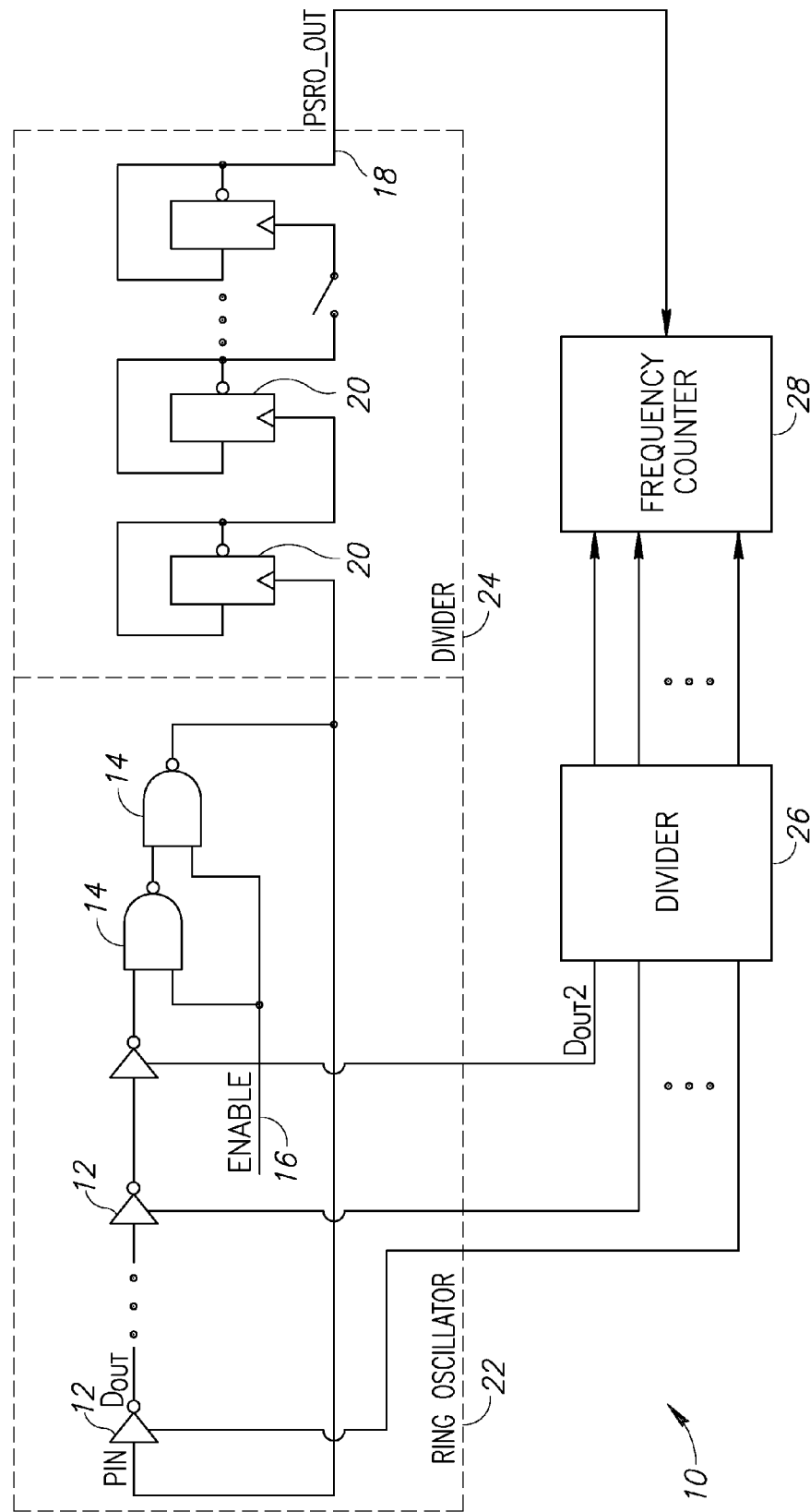
FIG. 1 is a schematic diagram illustrating a ring oscillator circuit.

A schematic diagram illustrating a ring oscillator circuit is shown in FIG. 1. The process sensitive ring oscillator (PSRO), generally referenced 10, comprises a ring oscillator circuit portion 22 coupled to a frequency divider circuit portion 24. The ring oscillator comprises an odd number of inverting elements (i.e. delay stages) 12 coupled to NAND gates 14. An ENABLE signal controls the oscillator. The divider circuit comprises a plurality of cascaded flip flops 20 configured to divide down the frequency of oscillation to a more convenient level for the external frequency counter 28. Instability output signals $D_{OUT2}$ from each delay stage provides an indication of an instability problem in one or more delay stages.

Typically, the frequency of the output of the ring oscillator is too high to being out on a chip pin (e.g., 1 GHz), thus it is required to divide down by a suitable factor (e.g., 1024) resulting in a lower frequency (e.g., 1 MHz). A $2^N$ divider 24 (e.g., N=10) is operative to divide down the output of the ring oscillator while divider 26 is operative to divide down the individual $D_{OUT2}$ signals. A drop in the PSRO_OUT frequency indicates that one or more delay stages experience a read instability problem. In addition, any activity on any of the $D_{OUT2}$ signal lines indicate an instability problem as well. The number of pulses present on the $D_{OUT2}$ signal lines corresponds to the number of read instability events that occurred in each delay stage. This will also cause a drop in the ring oscillator frequency on output signal PRSO_OUT which can be measured by the frequency counter 28.

Figure 2:
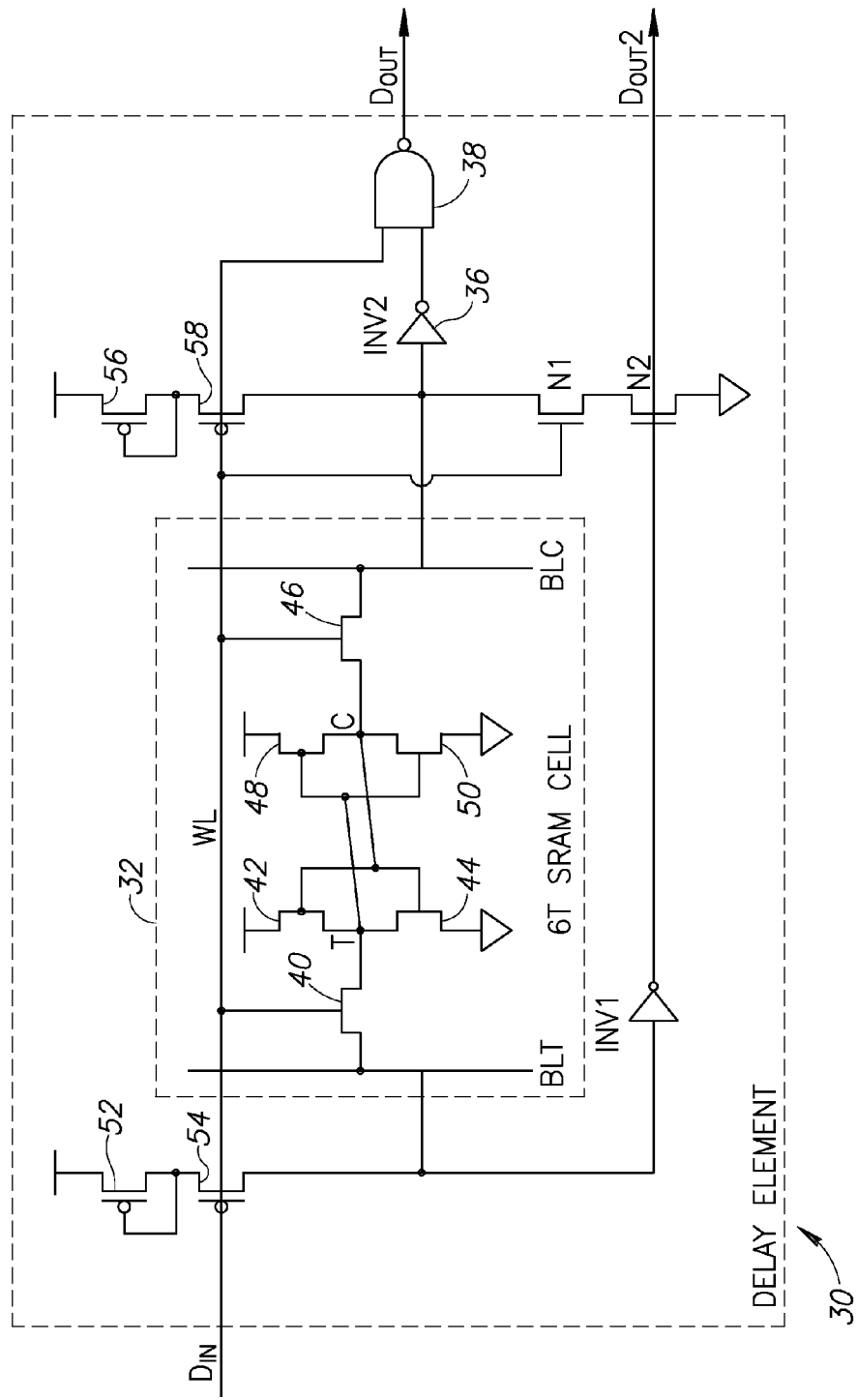
FIG. 2 is a schematic diagram illustrating an example process sensitive ring oscillator circuit constructed in accordance with the invention.

A schematic diagram illustrating an example delay stage of the process sensitive ring oscillator circuit constructed in accordance with the invention is shown in FIG. 2. The delay stage circuit, generally referenced 30, comprises an actual unmodified SRAM cell 32 (e.g., a 6T SRAM cell) with a small amount of additional circuitry required to enable the ring oscillator to oscillate. The additional circuitry includes inverters INV1 34 and INV2 36, NAND gate 38, transistors N1, N2, 52, 54, 56 and 58.

The delay element circuit is used in each delay stage 12 (FIG. 1) of the ring oscillator. The PSRO comprises a circuit for monitoring the delay and stability of an SRAM cell within its actual real neighborhood in an integrated circuit. One of the advantages in using the SRAM cell in the delay element of the PSRO is that measuring the frequency of a ring oscillator is much easier than (1) measuring the phase difference of signals; (2) generating signals with precise phase; and (3) delivering such signals to and from the chip.

The PSRO circuit enables measuring the delay from wordline input to bitline output of the SRAM memory cell. This is achieved by making this delay part of a ring oscillator and measuring the frequency of the oscillator. It also gives an indication of a non-stable data, where a READ operation changes the contents of an SRAM cell.

The problem in making the wordline-to-bitline (WL2BL) delay a part of a ring oscillator is that the wordline input is only active at its rising edge, upon opening the SRAM cell for reading, but not on its failing edge. Thus, a simple connection would not enable the oscillation.

This is overcome by use of a delay stage circuit in which the rising edge of the wordline input is used to produce the falling edge of the output by pulling down the bitline, while the falling edge of the wordline is used for both pulling up the output by external logic, as well as for precharging the bitline to a proper level of voltage.

In this manner, the frequency of the input to the delay stage is the same as that of its output, and the WL2BL can be a part of a ring oscillator. Measuring the frequency of such an oscillator enable the evaluation of the WL2BL delay.

Note that the initial state of the SRAM cell is guaranteed by INV1 and N1/N2 if cell wakes up with '0' on the T side, it will be "written" with the opposite data in the consecutive cycle and will maintain this state unless stability is disturbed for some reason.

Stability is monitored by setting the cell to a pre-defined value and then observing whether data in the cell ever changes. If it does, a special pulse on the $D_{OUT2}$ line is generated that indicates the existence of a stability problem.

In operation of the circuit 30, an assumption is that a '0' is written into the cell's C-node and maintained there by the path BLT, INV1 and transistor pair N1/N2. The delay element operates as an inverting element to enable the PSRO to oscillate. When $D_{IN}$='0', the wordline WL is '0' and $D_{OUT}$ is equal to $V_{CS}$. When $D_{IN}$='1', BLT=$V_{DD}$, the wordline WL is $V_{DD}$ '1', BLC='0' and $D_{OUT}$ is equal to '0'. Inverter INV1 forces a '1' on the gate of N2 which pulls BLC down to ground and forces C='0' and T='1'.

The $D_{IN}$ to $D_{OUT}$ delay on a $D_{IN}$ falling edge is equal to the sum of the PMOS delay and NAND delay. The $D_{IN}$ to $D_{OUT}$ delay on a $D_{IN}$ rising edge is equal to the sum of the wordline WL to bitline (BL) delay, INV2 delay and NAND delay. Therefore, the cycle time of K such units is as follows:

$$T_{cycle}=K \cdot [d(\text{PMOS})+d(\text{WL2BL})+d(\text{INV})+2 \cdot d(\text{NAND})]$$

A deviation in the SRAM cell behavior, i.e. the read time, is reflected in the frequency of the ring oscillator and after frequency division can be measured using an external frequency counter. A data retention failure (i.e. cell instability) can be detected by a rise in the $D_{OUT2}$ signal. Glitches seen at $D_{OUT2}$ indicate the existence of a random read instability problem.

Note that in operation, INV1, INV2, N1, N2 and the NAND are part of the additional test circuitry added to the SRAM cell to enable oscillation of the PSRO and evaluation of delay and stability of the cell.

Note also that if for some reason BLT goes to '0', INV1, N1 and N2 will correct this and set BLT to '1' and a '1' pulse will appear at $D_{OUT2}$. If this occurs more than once at startup, it indicates a cell stability problem.

Figure 3:
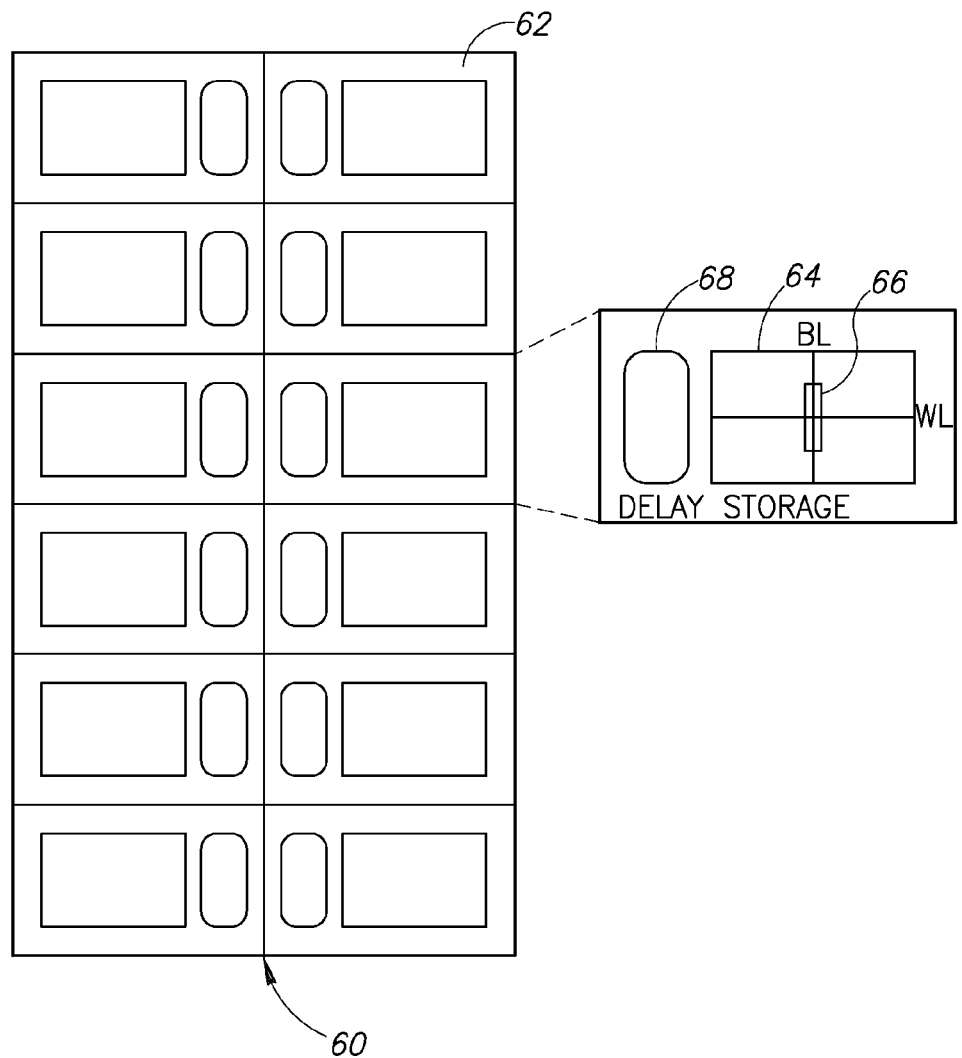
FIG. 3 is a diagram illustrating an example layout of the DMRO circuit.

A diagram illustrating an example layout of the DMRO circuit is shown in FIG. 3. The DMRO layout, generally referenced 60, comprises a plurality of stages 62. Each stage comprises a mini array 64 and control logic circuitry 68. The SRAM cell under test 66 is placed within the mini array 64 in order to emulate realistic capacitance and resistance conditions on the bitline as much as possible. Note that the cell under test can be selected to be in any orientation compared to the bitline, e.g., near or far or mid-way along the bitline, so as to test the cell in multiple and various places and conditions. Several instances of the DMRO circuit 60 may be placed strategically around the chip such as in places known or expected to have process gradients.

Figure 4:
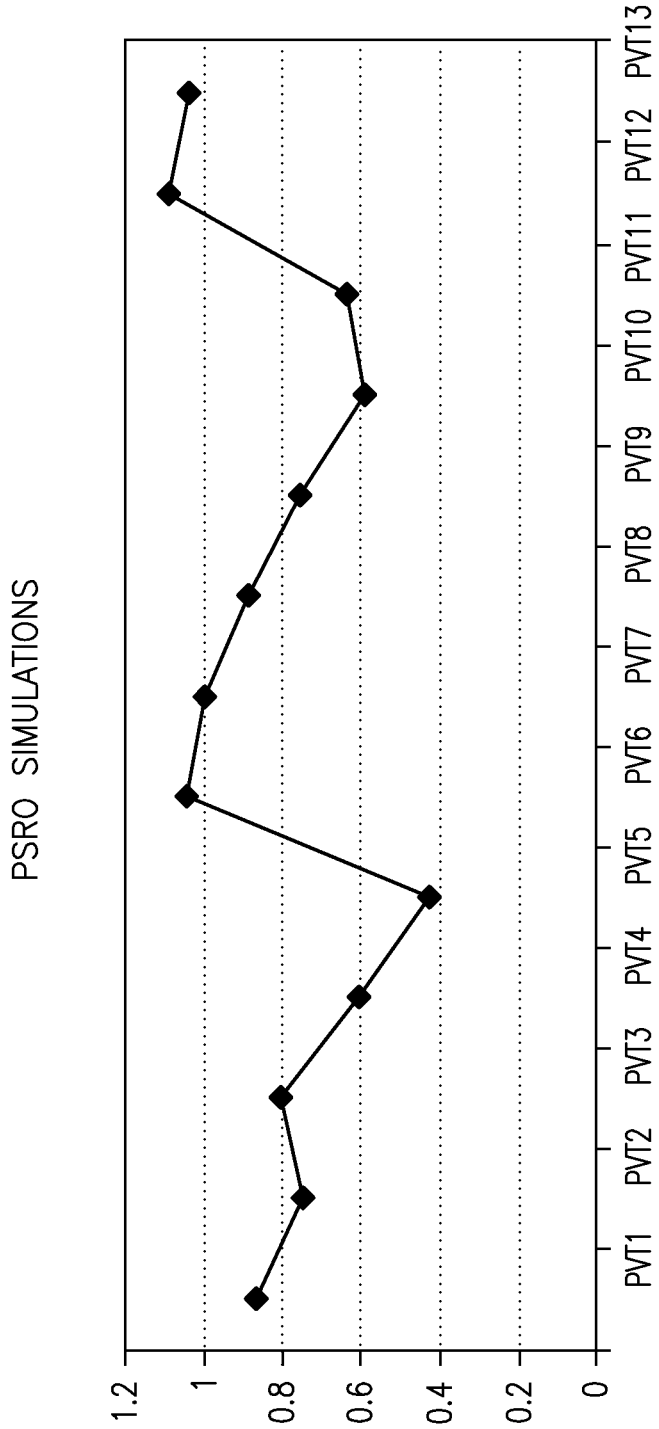
FIG. 4 is a graph illustrating frequency as a function of PVT variations.

A graph illustrating frequency as a function of PVT variations is shown in FIG. 4. As an example, a graph is shown that plots frequency versus several example PVT variations. PVT voltage variations range from 600 mV to 1000 mV, while PVT temperature variations range from 15 degrees to 85 degrees.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of measuring the delay from wordline input to bitline output of a static random access memory (SRAM) cell, said method comprising:
   providing a plurality of delay stage circuits configured to form a ring oscillator, each said delay stage comprising an SRAM cell;
   generating a falling edge in the output of each delay stage circuit in response to a rising edge of said wordline input;
   generating a rising edge in the output of each delay stage circuit in response to a falling edge of said wordline input;
   measuring the frequency of said ring oscillator thereby evaluating the wordline to bitline delay of said SRAM cell; and
   monitoring stability of said SRAM cell by setting said SRAM cell to a predefined value and observing whether data in said SRAM cell changes.

2. The method according to claim 1, further comprising precharging the bitline to an appropriate charge level in response to the falling edge of said wordline.

3. The method according to claim 1, wherein if cell data does change, generating a second output indicating existence of a stability problem.

4. The method according to claim 1, further comprising guaranteeing an initial state of said delay stage circuit whereby an incorrect state is corrected in a subsequent memory cycle.

5. The method according to claim 1, further comprising locating cell under test within a mini-array so as to emulate realistic capacitance and resistance conditions on said bitline.

6. A direct memory ring oscillator (DMRO) circuit for measuring the wordline to bitline delay of a static random access memory (SRAM) cell, comprising:
   a plurality of delay stage circuits, each delay stage circuit comprising:
   an SRAM cell;
   circuitry operative to generate a falling edge of the output of a delay stage circuit in response to the rising edge of the wordline, to generate a rising edge of the output of said delay stage circuit in response to the falling edge of the wordline, to measure the frequency of said ring oscillator thereby evaluating the wordline to bitline delay of said SRAM cell, and to monitor stability of said SRAM cell by setting said SRAM cell to a predefined value and observing whether data in said SRAM cell changes;
   wherein measuring the frequency of said DMRO corresponds to the wordline to bitline delay of said SRAM cell.

7. The circuit according to claim 6, further comprising circuitry operative to precharge the bitline to an appropriate charge level in response to the falling edge of said wordline.

8. The circuit according to claim 6, further comprising circuitry operative to generate a second output indicating a stability problem in response to detecting a change in said predefined value.

9. The circuit according to claim 6, further comprising circuitry operative to guarantee an initial state of said delay stage circuit whereby an incorrect state is corrected in a subsequent memory cycle.

10. The circuit according to claim 6, further comprising placing the cell under test in a mini-array of SRAM cells so as to emulate realistic conditions as much as possible.

11. A method of measuring the delay and stability of a static random access memory (SRAM) cell, said method comprising:
    incorporating the delay from a wordline input to a bitline output of said SRAM cell into delay stages of a ring oscillator;
    measuring the frequency of oscillation of said ring oscillator, wherein said frequency corresponds to said wordline to bitline delay; and
    monitoring stability of said SRAM cell by setting said SRAM cell to a predefined value and observing whether data in said SRAM cell changes.

12. The method according to claim 11, further comprising generating a falling edge in the output of each delay stage circuit in response to a rising edge of said wordline input, and generating a rising edge in the output of each delay stage circuit in response to a falling edge of said wordline input.

13. The method according to claim 11, further comprising precharging the bitline to an appropriate charge level in response to the falling edge of said wordline.

14. The method according to claim 11, wherein if cell data does change, generating a second output indicating existence of a random read instability problem.

15. The method according to claim 11, further comprising guaranteeing an initial state of said delay stage circuit whereby an incorrect state is corrected in a subsequent memory cycle.

16. The method according to claim 11, further comprising locating the cell under test within a mini-array so as to emulate realistic conditions of operation.

17. The method according to claim 11, further comprising wherein drop in frequency indicates read instability in said SRAM cell.

* * * * *